US 6,524,947 B1

(12) United States Patent
Subramanian et al.

(10) Patent No.: US 6,524,947 B1
(45) Date of Patent: Feb. 25, 2003

(54) SLOTTED TRENCH DUAL INLAID STRUCTURE AND METHOD OF FORMING THEREOF

(75) Inventors: Ramkumar Subramanian, San Jose, CA (US); Todd P. Lukanc, San Jose, CA (US); Fei Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/774,800

(22) Filed: Feb. 1, 2001

(51) Int. Cl.[7] .................... H01L 21/4763; H01L 21/44
(52) U.S. Cl. .................. 438/637; 438/638; 438/639; 438/640; 438/618; 438/624; 438/687
(58) Field of Search ................. 438/618, 624, 438/637, 638, 639, 640, 634, 687

(56) References Cited

U.S. PATENT DOCUMENTS

| | | | |
|---|---|---|---|
| 6,060,380 A | | 5/2000 | Subramanian et al. |
| 6,071,806 A | * | 6/2000 | Wu et al. .................... 438/622 |
| 6,156,643 A | * | 12/2000 | Chan et al. .................. 438/638 |
| 6,165,891 A | * | 12/2000 | Chooi et al. ................. 438/622 |
| 6,177,364 B1 | * | 1/2001 | Huang ......................... 438/792 |
| 6,180,516 B1 | * | 1/2001 | Hsu ............................. 438/638 |
| 6,337,519 B1 | * | 1/2001 | Watatani ..................... 257/759 |
| 6,218,287 B1 | * | 4/2001 | Matsumoto ................. 438/624 |
| 6,281,121 B1 | * | 8/2001 | Brown et al. ................ 438/672 |
| 6,284,645 B1 | * | 9/2001 | Lai et al. ..................... 438/624 |
| 6,287,960 B1 | * | 9/2001 | Lao ............................. 438/637 |
| 6,297,149 B1 | * | 10/2001 | Stamper ...................... 438/637 |
| 6,309,962 B1 | * | 10/2001 | Chen et al. .................. 438/638 |
| 6,309,970 B1 | * | 10/2001 | Ito et al. ...................... 438/687 |
| 6,326,297 B1 | * | 12/2001 | Vijayendran ................. 438/627 |
| 6,376,366 B1 | * | 4/2002 | Lin et al. ..................... 438/637 |
| 6,383,912 B1 | * | 5/2002 | Chung et al. ................ 438/624 |
| 6,406,994 B1 | * | 6/2002 | Ang et al. ................... 438/637 |

FOREIGN PATENT DOCUMENTS

| | | | |
|---|---|---|---|
| JP | 404359545 A | * | 12/1992 |
| JP | 405182966 A | * | 7/1993 |
| JP | 406013470 A | * | 1/1994 |
| JP | 406045453 A | * | 2/1994 |
| JP | 406069349 A | * | 3/1994 |

* cited by examiner

Primary Examiner—Caridad Everhart
Assistant Examiner—Chuong A Luu

(57) ABSTRACT

A method of manufacturing a semiconductor structure, including etching an opening in a hard mask layer including a trench pattern width a first portion having a first width and a second portion being an oversized trench portion having a second width greater than a width of the first portion, the second portion being formed over a predetermined via location. Also including are steps of depositing a resist and patterning a via pattern in the predetermined via location, etching a via corresponding to the via pattern through the resist and at least partially through a dielectric layer, and etching an oversized trench portion corresponding to a second portion opening in the hard mask.

20 Claims, 14 Drawing Sheets

SLOTTED TRENCH DUAL INLAID STRUCTURE AND METHOD OF FORMING THEREOF

FIELD OF THE INVENTION

The present invention relates to the manufacturing of semiconductor devices, and more particularly, to a dual inlaid structure.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene" or "inlaid"-type processing. Generally, this process involves forming a via opening in the inter-metal dielectric layer or interlayer dielectric (ILD) between vertically spaced metallization levels. The via opening is subsequently filled with metal to form a via electrically connecting the vertically spaced apart metal features. The via opening is typically formed using conventional lithographic arid etching techniques. After the via opening is formed, the via is filled with a conductive material, such as tungsten (W), using conventional techniques, and the excess conductive material on the surface of the inter-metal dielectric layer is then typically removed by chemical mechanical planarization (CMP).

A variant of the above-described process, termed "dual inlaid" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual inlaid process is that the contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

Copper (Cu) and Cu-based alloys are becoming increasingly attractive for use in VLSI and ULSI semiconductor devices, which require multi-level metallization levels. Cu and Cu-based alloy metallization systems have very low resistivities which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Another technique to increase the circuit speed is to reduce the capacitance of the inter-metal dielectric layers. Dielectric materials such as silicon oxide ($SiO_2$) have been commonly used to electrically separate and isolate or insulate conductive elements of the integrated circuit from one another. However, as the spacing between these conductive elements in the integrated circuit structure has become smaller, the capacitance between such conductive elements because of the dielectric being formed from silicon oxide is more of a concern. This capacitance negatively affects the overall performance of the integrated circuit because of increased power consumption, reduced speed of the circuitry, and cross-coupling between adjacent conductive elements.

A response to the problem of capacitance between adjacent conductive elements caused by use of silicon oxide dielectrics has led to the use of other dielectric materials, commonly known as low-k dielectrics. Whereas silicon oxide has a dielectric constant of approximately 4.0, many low-k dielectrics have dielectric constants less than 3.5. Examples of low-k dielectric materials include organic or polymeric materials. Another example is porous, low density materials in which a significant fraction of the bulk volume contains air, which has a dielectric constant of approximately 1. The properties of these porous materials are proportional to their porosity. For example, at a porosity of about 80%, the dielectric constant of a porous silica film, i.e. porous $SiO_2$, is approximately 1.5.

A problem associated with the use of many low-k dielectric materials is that these materials can be damaged by exposure to oxidizing or "ashing" systems, which remove a resist mask used to form openings, such as vias, in the low-k dielectric material. This damage can cause the surface of the low-k dielectric material to become a water absorption site, if and when the damaged surface is exposed to moisture. Subsequent processing, such as annealing, can result in water vapor formation, which can interfere with subsequent filling with a conductive material of a via/opening or a inlaid trench formed in the dielectric layer. For this reason, the upper surface of the low-k dielectric material is typically protected from damage during removal of the resist mask by a capping layer, such as silicon oxide, disposed over the upper surface.

A number of different variations of an inlaid process using low-k dielectrics have been employed during semiconductor manufacturing.

FIGS. 1A–1J depict a first dual inlaid process for forming vias and a second metallization level over a first metallization level, according to conventional techniques.

In FIG. 1A, a first etch stop layer 12 is deposited over a first metallization level 10. The first etch stop layer 12 acts as a passivation layer that protects the first metallization level 10 from oxidation and contamination and prevents diffusion of material from the first metallization level 10 into a subsequently formed dielectric layer. The first etch stop layer 12 also acts as an etch stop during subsequent etching of the dielectric layer. A typical material used as an etch stop is silicon nitride, which may be deposited by PECVD.

In FIG. 1B, a first dielectric layer 14 is deposited over first etch stop layer 12, typically by spinning a liquid dielectric material onto the first etch stop layer 12 surface under ambient conditions to a desired depth. This is typically followed by a heat treatment to evaporate solvents present within the liquid dielectric material and to cure the film to form the dielectric layer 14.

In FIG. 1C, a second etch stop layer 40, also known as a middle stop layer or hard mask layer, is deposited over the first dielectric layer 14. The second etch stop layer 40 acts as an etch stop during etching of a dielectric layer subsequently formed over the second etch stop layer 40. As with the first etch stop layer 12, the second etch stop layer 40 may comprise a silicon nitride or silicon oxynitride deposited by PECVD. A via pattern 41 is etched into the second etch stop layer 40 using conventional photolithography and appropriate anisotropic dry etching techniques, such as an $O_2$ or $(H_2+N_2)$ etch. These steps are not depicted in FIG. 1C and only the resulting via pattern 41 is depicted therein. The photoresist used in the via patterning is removed by an oxygen plasma, for example.

In FIG. 1D, a second dielectric layer 42 is deposited over the second etch stop layer 40. After formation of the second dielectric layer 42, a capping layer or hard mask 13 can be formed over the second dielectric layer 42. The function of the capping layer 13 is to protect the second dielectric layer 42 from the process that removes a subsequently formed resist layer. The capping layer 13 can also be used as a mechanical polishing stop to prevent damage to the second dielectric layer 42 during subsequent polishing away of conductive material that is deposited over the second dielectric layer 42 and in a subsequently formed via and trench. Examples of materials used as a capping layer 13 include silicon oxide and silicon nitride.

In FIG. 1E, the pattern of the trenches are formed in the capping layer 13 using conventional lithographic and etch techniques. The lithographic process involves depositing a resist 44 over the capping layer 13 and exposing and developing the resist 44 to form the desired pattern of the trench. The first etch, which is an anisotropic etch highly selective to the material of the capping layer and exposed portions of the resist 44, such as a reactive ion plasma dry etch, removes the exposed portions of the resist and underlying exposed portions of capping layer 13.

In FIG. 1F, a second etch, which is highly selective to the material of the first dielectric layer 14 and second dielectric layer 42, anisotropically removes the dielectric material until the first etch stop layer 12 is reached. In this way, a trench 50 and via 51 are formed in the same etching operation. The second etch is typically an anisotropic etch, such as a reactive ion plasma dry etch, that removes only the exposed portions of the first low-k dielectric layer 14 directly below the opening in the second etch stop layer 40 and the exposed portions of the low-k dielectric materials. By using an anisotropic etch, the via 51 and the trench 50 can be formed with substantially perpendicular sidewalls.

The thickness of the trench photoresist is selected to be completely consumed by the end of the etch operation, to eliminate the need for photoresist stripping. This results in the structure depicted in the top portion of FIG. 1G, wherein all of the photoresist has been stripped. Another etch, which is highly selective to the material of the first etch stop layer 12, then removes the portion of the etch stop layer 12 underlying via 51 until the etchant reaches the first metallization level 10. This etch is also typically a dry anisotropic etch chemistry designed not to attack any other layers in order to expose a portion of the metallization.

In FIG. 1H, an adhesion/barrier material, such as tantalum, titanium, tungsten, tantalum nitride, or titanium nitride, is deposited. The combination of the adhesion and barrier material is collectively referred to as a diffusion barrier layer 20. The diffusion barrier layer 20 acts to prevent diffusion into the first and second dielectric layers 14, 42 of the conductive material subsequently deposited into the via 51 and trench 50.

In FIG. 1I, a layer 22 of a conductive material for example, a Cu or Cu-based alloy, is deposited in the via 51 and trench 50 and over the capping layer 13. A typical process initially involves depositing a "seed" layer on the barrier layer 20 subsequently followed by conventional plating techniques, e.g., electroless or electroplating techniques, to fill the via 51 and trench 50. So as to ensure complete filling of the via 51 and trench 50, the Cu-containing conductive layer 22 is deposited in trench 50 and via 51 and over the upper surface of the capping layer 13.

In FIG. 1J, the entire excess thickness of the metal overburden layer 24 over the upper surface of the capping layer 13 is removed using a CMP process. A typical CMP process utilizes an alumina ($Al_2O_3$)-based slurry, which leaves a conductive plug in the via 51 and a second metallization level in the trench 50. The second metallization level has an exposed upper surface which is substantially co-planar with the upper surface of the capping layer 13.

One problem associated with the above-identified process is overlay error. Since integrated circuits are fabricated by patterning a plurality of layers in a particular sequence to generate features that require a particular spatial relationship with respect to one another, as shown in FIGS. 1A–1J, above, each layer must be properly aligned with respect to previously patterned layers to minimize the size of individual devices and thus maximize the packing density on the substrate. A perfect overlap is not easily achieved and some misalignment is common. Excessive misalignment between successive masks used in the manufacture of the semiconductor integrated circuit can produce an overlay error that may ultimately result in the failure of the circuit to operate properly. For example, this overlay error may cause a reduction in the final via size with a corresponding increase in via resistance. Therefore, an overlay tolerance or overlay "budget", as defined by the particular tools and processes employed, is required between two layers to ensure reliability in the construction of the resulting device.

An example of overlay error in the fabrication of a dual inlaid semiconductor structure in accord with the above process is depicted in plan view in FIG. 2A and in cross-section in FIGS. 2B and 2C. FIG. 2A shows a step in the fabrication process wherein a trench 200 is etched to reach a previously formed via hole pattern 250. FIG. 2B depicts in cross-section trench pattern 200, resist layer 202, hard mask layer 204, dielectric layer 206, middle stop layer 208, dielectric layer 210, etch stop layer 212, metallization layer 214, and via hole pattern 250. This structure, and the method for forming the structure, comports with the method and structure for forming a dual inlaid structure, discussed above, and a detailed discussion is therefore omitted. As shown, an overlay error exists between the via hole pattern 250 formed in middle stop layer 208 and the trench pattern 200 formed in hard mask layer 204. Upon formation of a trench and a via hole, in a manner as described above, the width of the resulting via contact $W_2$ is less than the intended width $W_1$. To overcome this problem, an overlay budget is conventionally applied to the via hole pattern 250 wherein approximately half of the overlay budget is applied to each side of the via hole pattern 250 width. However, this process requires numerous steps to form the dual inlaid structure and is complex.

Another conventional dual inlaid process for forming vias and a second metallization level over a first metallization level is shown in FIGS. 3A–3D.

In FIG. 3A, an etch stop layer 310 comprising a suitable etch stop material, such as silicon nitride, is deposited over a metallization level 300. The etch stop layer 310 acts as a passivation layer that protects the metallization level 300 from oxidation and contamination and prevents diffusion of material from the metallization level 300 into a subsequently formed dielectric layer. The etch stop layer 310 also acts as an etch stop during subsequent etching of the dielectric layer. A dielectric layer 320 is deposited over etch stop layer 310. The dielectric layer may comprise a conventional dielectric or a low-k dielectric material. A hard mask layer 330 is deposited over dielectric layer 320 and may comprise, for example, a silicon carbide or silicon oxynitride. A resist 340 is deposited over hard mask layer 330.

As shown in FIG. 3B, a trench pattern 355 is lithographically formed in the resist 340 using conventional photolithography and appropriate anisotropic dry etching techniques. These steps are not depicted in FIG. 3B, and only the resulting structures are depicted. The patterning of resist 340 may be enhanced by use of an antireflective hard mask layer 330, such as silicon oxynitride. Portions of the hard mask layer 330 exposed by removing the exposed portions of the resist are then etched using conventional etching methods.

In FIG. 3C, the trench 360 is formed by anisotropically etching through dielectric layer 320 to an appropriate depth, determined by use of a closely timed etch. Alternatively, a middle stop layer (not shown) could be used. Subsequently, resist 340 used in the trench patterning is removed by an oxygen plasma, for example, and another resist 370 is applied over the hard mask layer 330 and trench 360.

As shown in FIG. 3D, a via 390 is formed using conventional photolithography and appropriate anisotropic dry etching techniques. These steps are not depicted in FIG. 3D, and only the resulting structure of the selective anisotropic etch of resist 370, dielectric layer 320, and etch stop layer 310 is shown. Subsequent to formation of the via 390 and trench 360, the resist 370 is removed and an adhesion/barrier material (not shown) is formed in the via 390 and trench 360. A conductive material such as Cu or Cu-based alloy is then deposited over the via 390 and trench 360, followed by chemical mechanical polishing.

However, the dual inlaid process illustrated in FIGS. 3A–3D patterns the via over a substantial step, which seriously degrades pattern fidelity due to the different thicknesses across the surface causing, for example, significant light scatter. Thus, lithography is made more difficult. Accordingly, a need exists for a method of forming a dual inlaid structure while minimizing the aforementioned disadvantages of conventional dual inlaid schemes and a need exists for a simplified dual inlaid scheme that minimizes a required number of process steps to form the dual inlaid structure.

SUMMARY OF THE INVENTION

The need in the art for a simplified method of forming a dual inlaid structure which accounts for overlay error and minimizes the required number of steps while overcoming some of the deficiencies of the conventional dual inlaid techniques is met by embodiments of the present invention.

These embodiments provide, in one aspect, a method of manufacturing a semiconductor structure including etching an opening in a hard mask layer including a trench pattern with a first portion having a first width and a second portion being an oversized trench portion having a second width greater than a width of the first portion, the second portion being formed over a predetermined via location. Also included are steps of depositing a resist and patterning a via pattern in the predetermined via location, etching a via corresponding to the via pattern through the resist and at least partially through a dielectric layer, and etching an oversized trench portion corresponding to the second portion opening in the hard mask.

In another aspect, the invention includes a method of manufacturing a semiconductor device including the steps of sequentially forming a metallization layer, an etch stop layer, a dielectric layer, and a hard mask layer, followed by etching an opening in a hard mask layer including a trench pattern with a first portion having a first width and a second portion being an oversized trench portion having a second width greater than a width of the first portion, the second portion being formed over a predetermined via location. The method also includes depositing a resist and patterning a via pattern in the predetermined via location, etching a via corresponding to the via pattern through the resist and at least partially through a dielectric layer; and etching an oversized trench portion corresponding to the oversized opening in the hard mask. In this aspect of the invention, an overlay budget is applied to each side of the oversized trench portion pattern across a width of the oversized trench portion pattern and to each side of the oversized trench portion pattern along E length of the oversized trench portion pattern.

In still another aspect, the invention includes a semiconductor device including at least one dielectric layer, a trench formed in the dielectric layer including a first portion having a first width and a second portion being an oversized trench portion having a second width greater than the first width of the first portion, wherein the second portion overlies a predetermined via location. A via is formed in the dielectric layer substantially in or adjacent the predetermined via location and circumferential edges of the oversized trench portion are displaced from corresponding edges of the via opening by at least a predetermined overlay budget.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

Figure 1A:
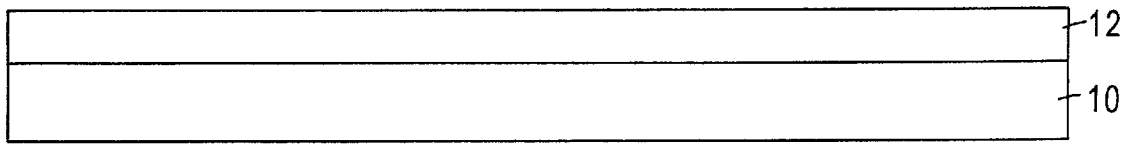
FIGS. 1A–1J illustrate sequential phases of a conventional dual inlaid process.
Figure 1B:
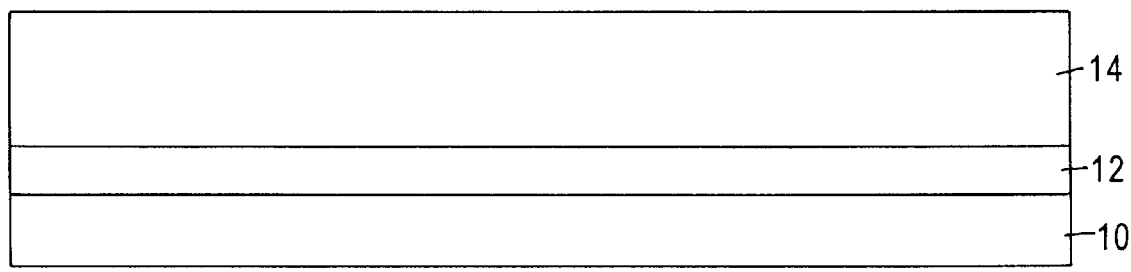
Figure 1C:
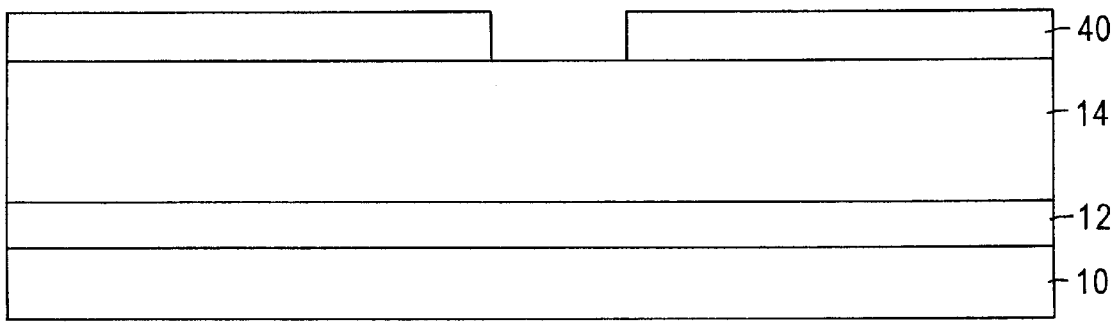
Figure 1D:
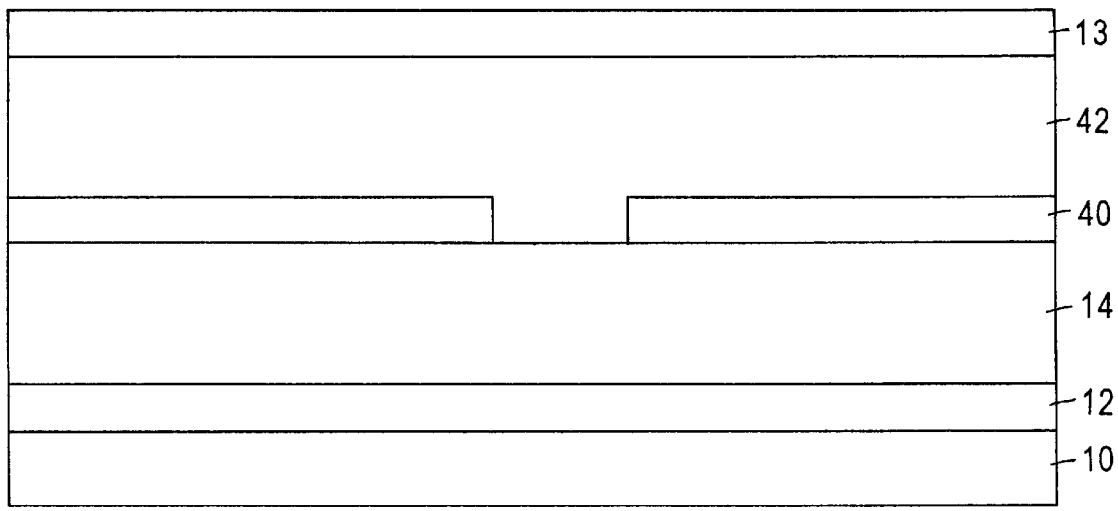
Figure 1E:
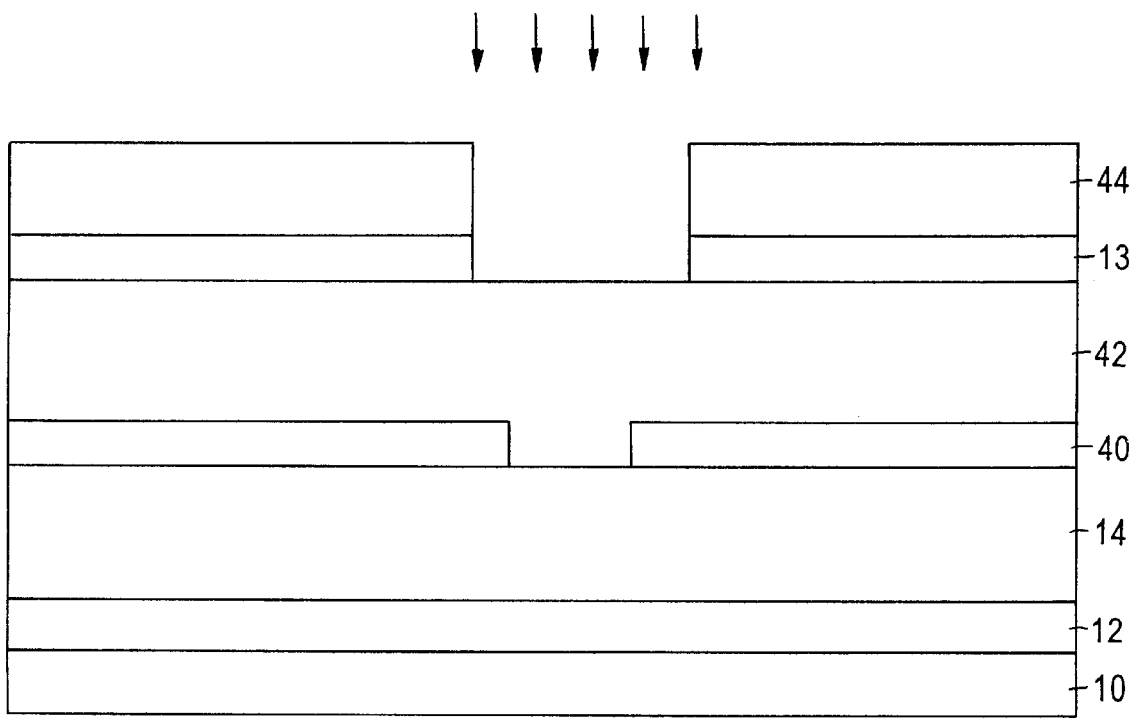
Figure 1F:
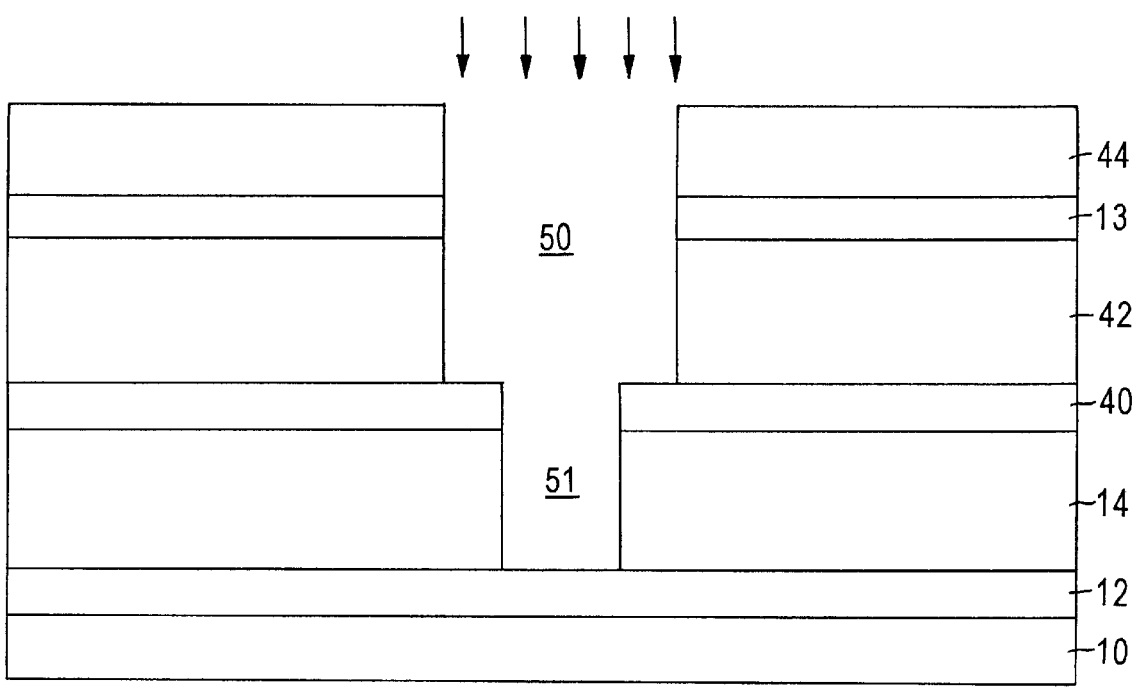
Figure 1G:
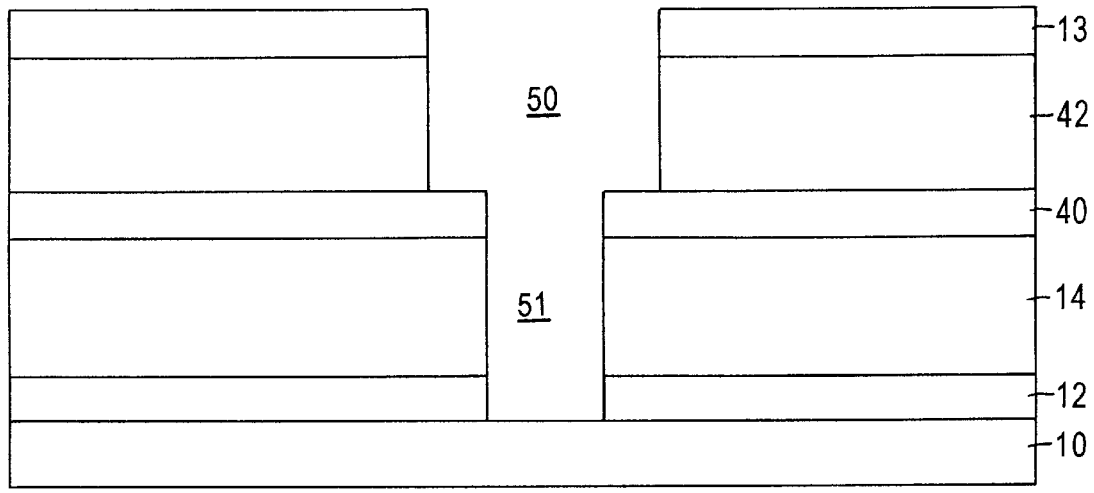
Figure 1H:
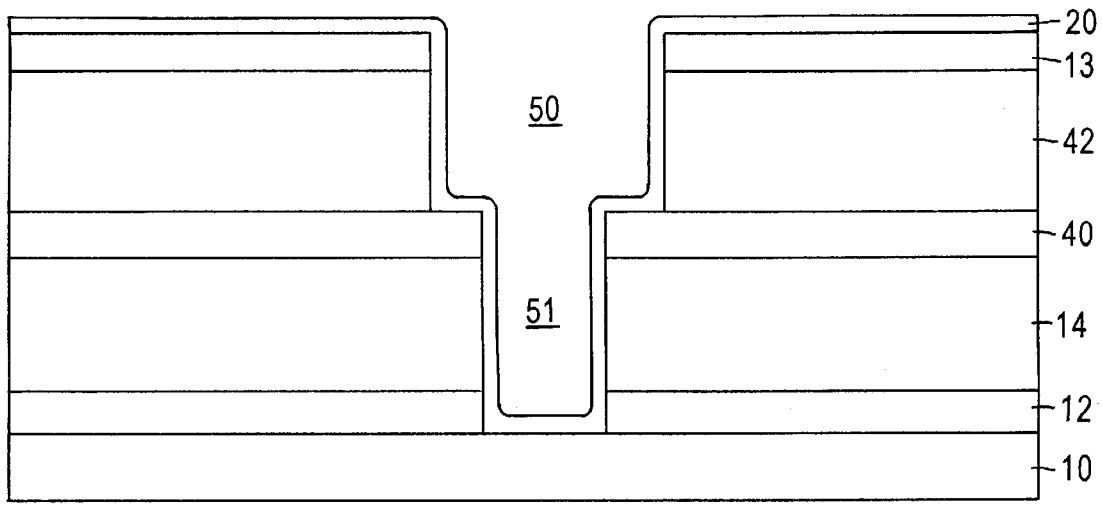
Figure 1I:
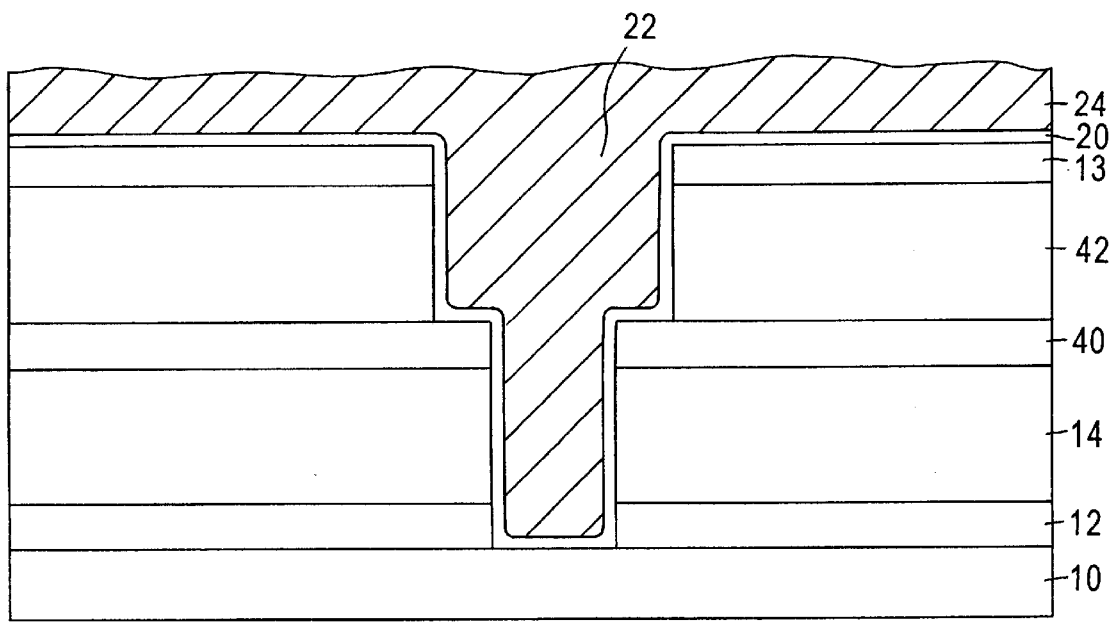
Figure 1J:
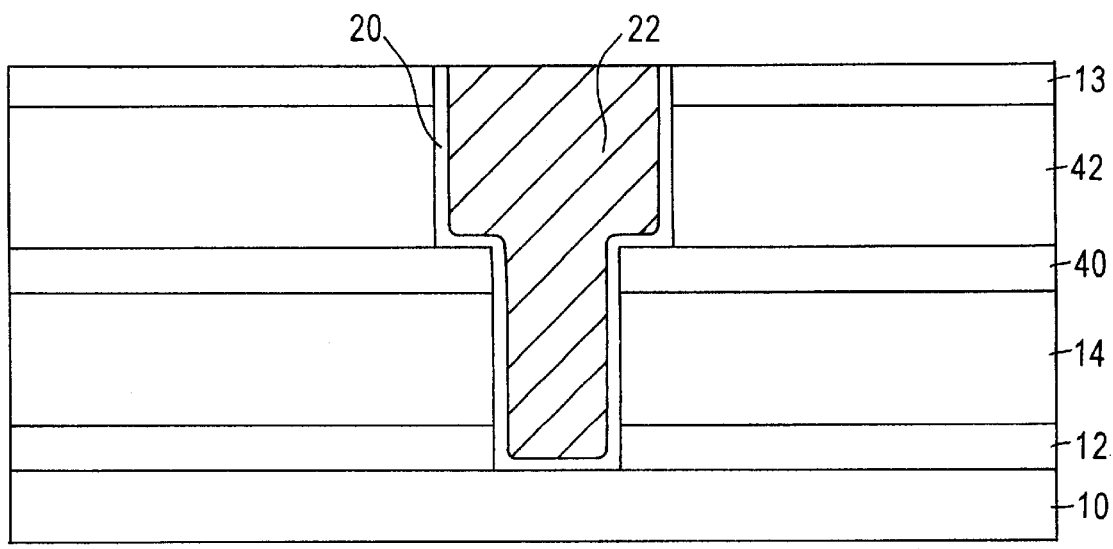
Figure 2A:
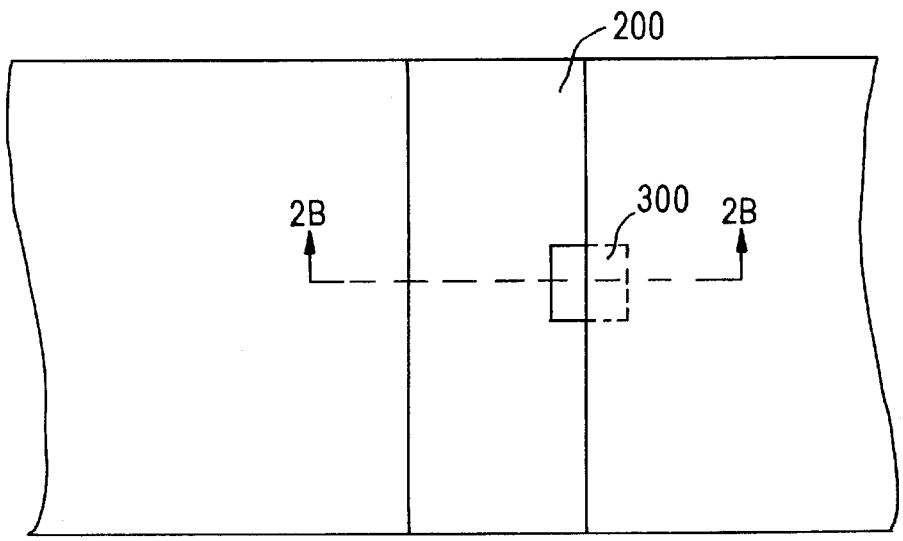
FIGS. 2A–2C illustrate via alignment problems associated with conventional dual inlaid processes.
Figure 2B:
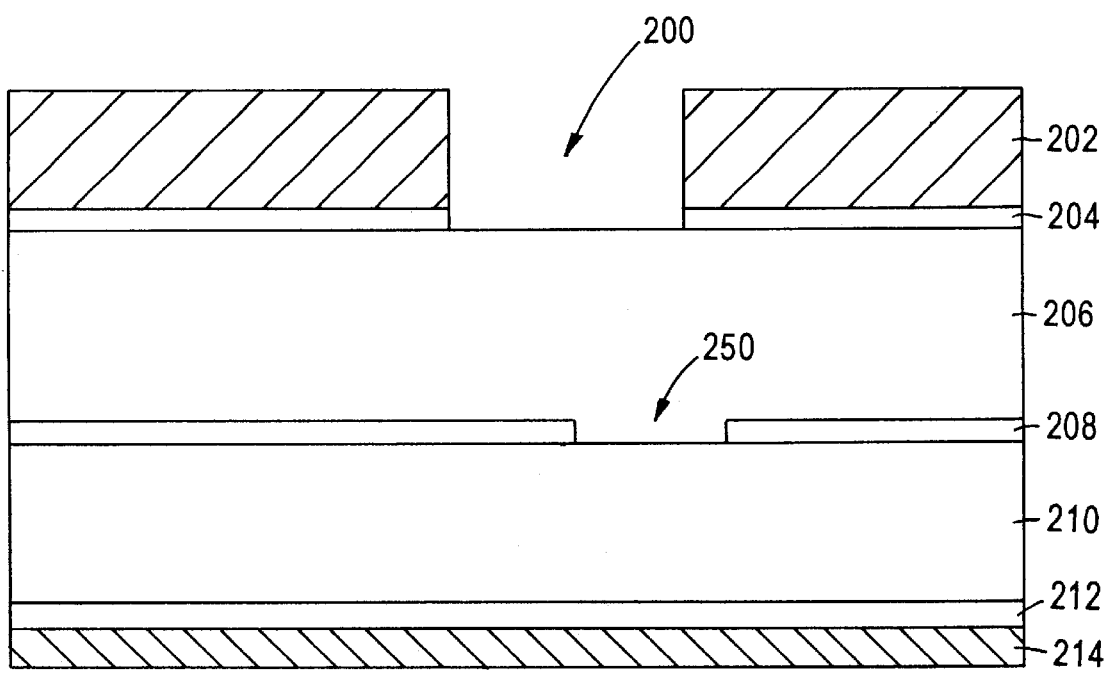
Figure 2C:
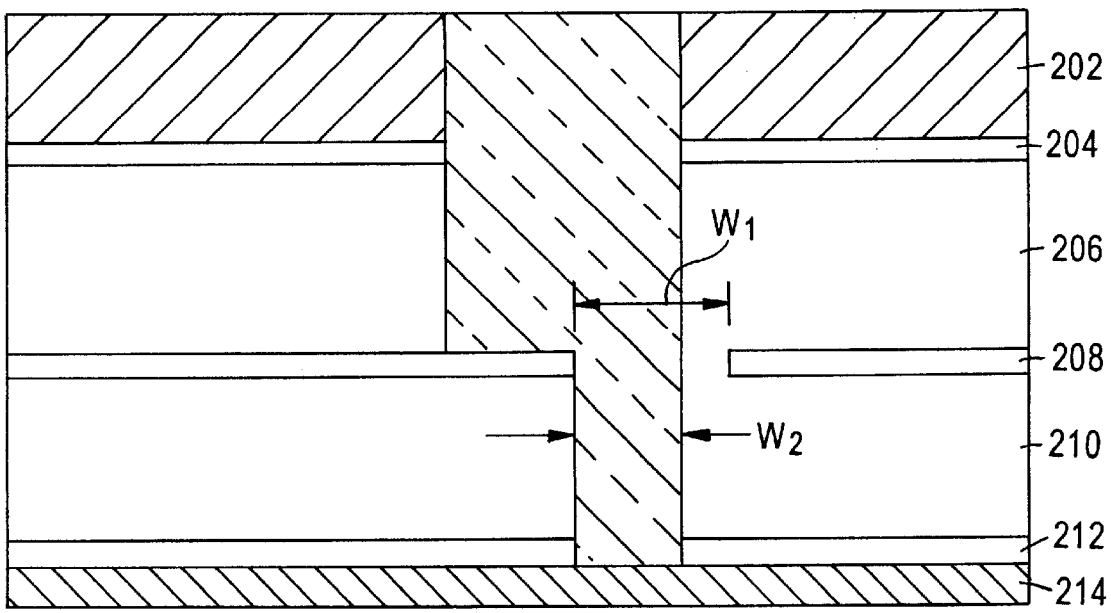
Figure 3A:
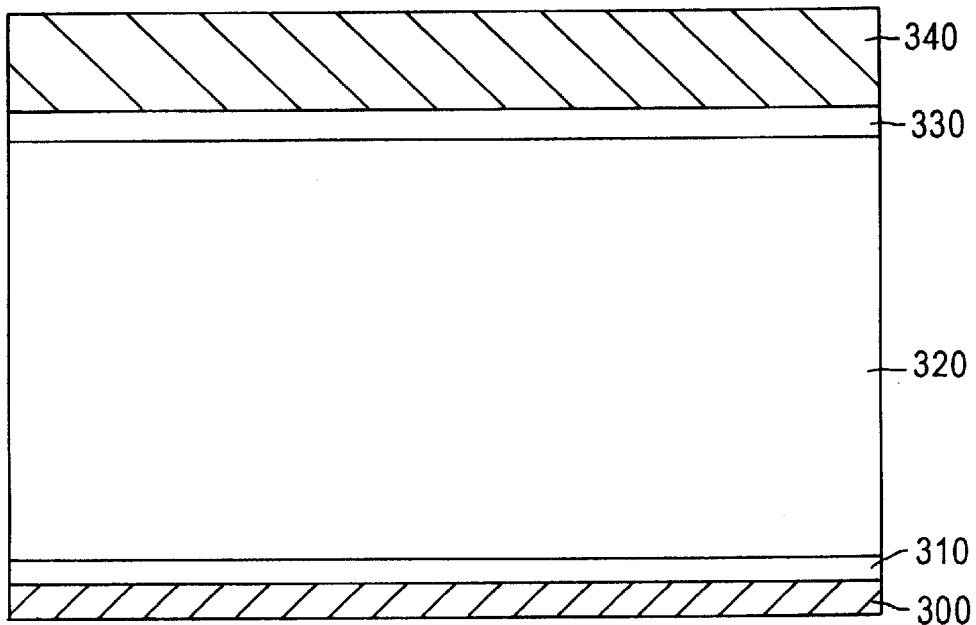
FIGS. 3A–3D illustrate sequential phases of a dual inlaid process in accord with another conventional dual inlaid process.
Figure 3B:
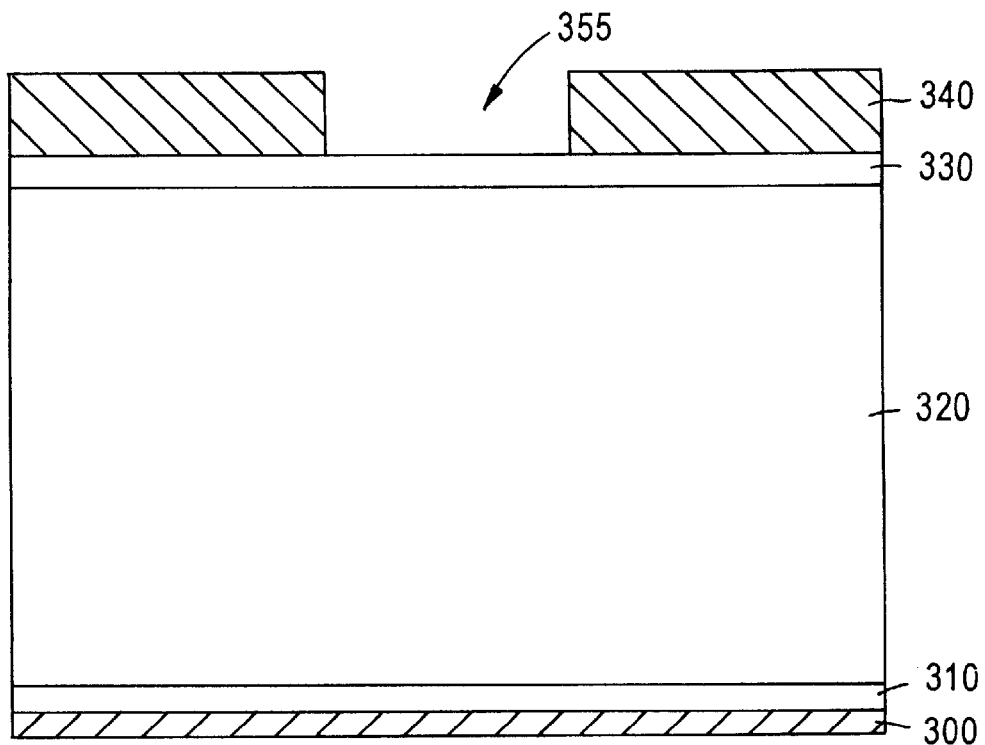
Figure 3C:
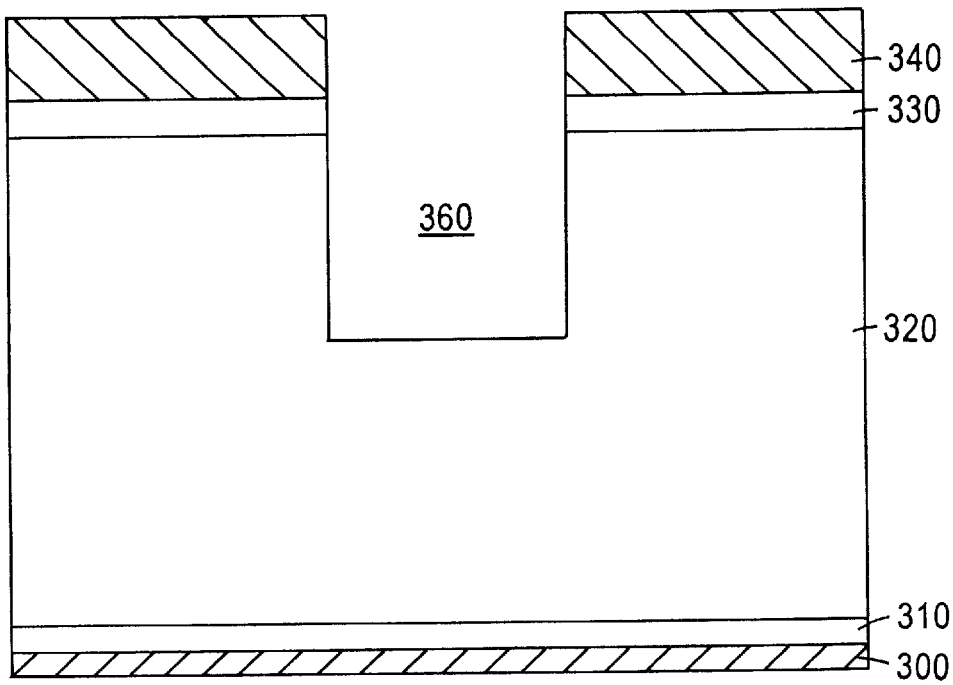
Figure 3D:
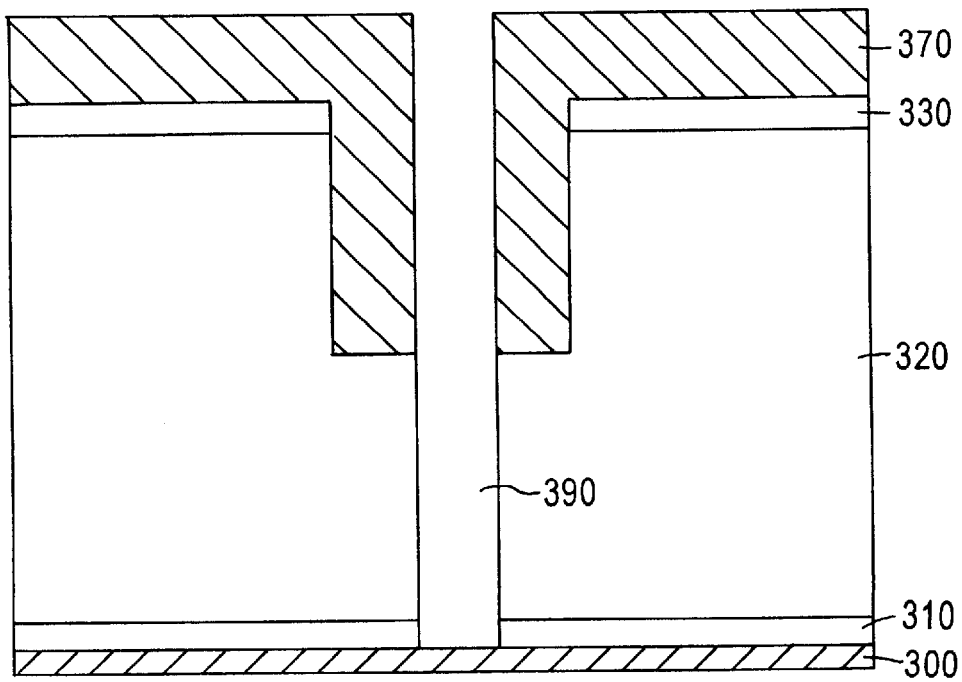

The figures referred to herein are drawn for clarity of illustration and are not necessarily drawn to scale and are not necessarily inclusive of every feature or aspect of the integrated circuits formed in conjunction with the aspects of the invention disclosed herein. Elements having the same reference numerals refer to elements having similar structure and function.

DETAILED DESCRIPTION OF THE INVENTION

The present invention addresses and provides a solution to some of the problems associated with overlay error between successive layers in semiconductor integrated circuits. Additionally, the present invention seeks to balance and minimize lithographic and etching disadvantages characteristic of conventional dual inlaid processes while in a preferred aspect minimizes a requisite number of steps required to realize the completed dual inlaid structure.

A method in accord with this embodiment of the invention is illustrated in FIGS. 4A–4J. The dual inlaid process to be described is illustrative of one sequence of steps, but is not limited to the particular sequence of steps described to provide the dual inlaid structure, as other sequences of steps capable of providing the dual inlaid structure can be used to practice the invention.

Figure 4A:
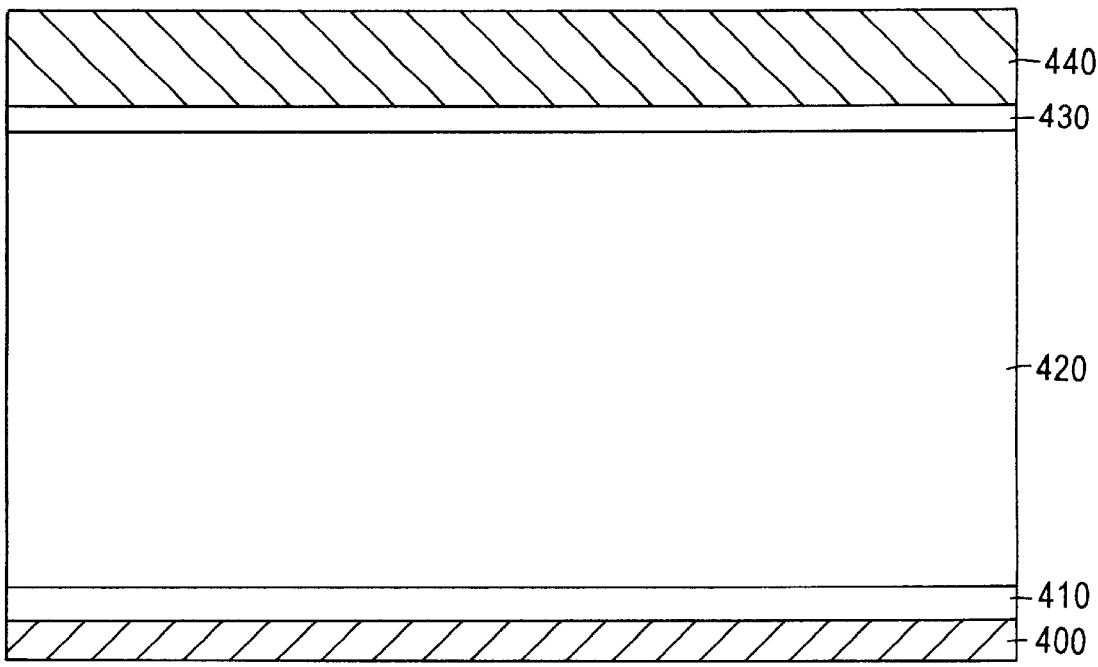
FIGS. 4A–4I depict sequential phases of a dual inlaid process in accord with the invention.

As illustrated in FIG. 4A, an etch stop layer 410 is deposited over a metallization layer 400. The etch stop layer 410 acts as an etch stop during etching of a subsequently formed dielectric layer. The etch stop layer 410 may be formed from silicon nitride, although the invention is not limited in this manner and may include any conventional etch stop material. Any process capable of depositing the etch stop layer 410 is acceptable for use with the invention, and an illustrative process for depositing silicon nitride is PECVD.

Figure 4B:
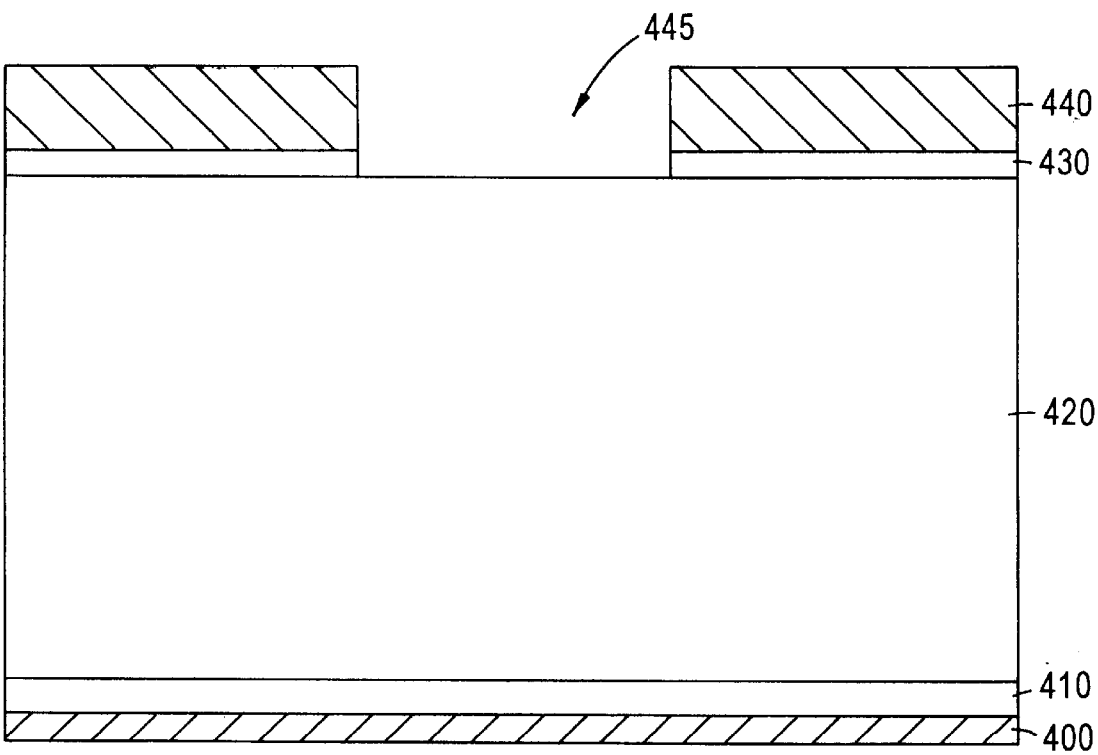

In FIG. 4B, a dielectric layer 420 is deposited over etch stop layer 410. The dielectric layer 420 can be formed from any material capable of acting as a dielectric, such as silicon oxide; fluorosilicate glass (FSG or SiOF); hydrogen silsesquioxane (HSQ); hydrogenated diamond-like carbon (DLC); polystyrene; nanoporous silica; fluorinated polyimides; parylene (AF-4); poly(arylene) ether; polytetrafluoroethylene (PTFE); divinyl siloxane bisbenzocyclobutene (DVS-BCB); aromatic hydrocarbons, hybridsilsesquioxanes; and siloxanes, silsesquioxanes, aerogels, and xerogels having varying degrees of porosity. Other dielectric materials, such as low-k dielectric materials, may also be used in accord with the invention. These dielectric materials can be applied via conventional spincoating, dip coating, spraying, meniscus coating methods, in addition to other coating methods that are well-known in the art.

After formation of the dielectric layer 420, a middle stop layer (not shown) may optionally be deposited by conventional methods over dielectric layer 420, followed by deposition of another dielectric layer (not shown) similar to conventional dual inlaid schemes wherein the middle stop layer demarks the regions defined by the trench, formed in an upper dielectric, and the via, formed in a lower dielectric. In the present aspect of the invention, however, a hard mask layer 430 is deposited on dielectric layer 420. This hard mask layer may be of silicon nitride (SiN) or silicon oxynitride (SiON), for example. In a preferred aspect, a SiON hard mask layer is used, as SiON is relatively antireflective to light, providing a low reflectivity and greater photolithographic contrast, as compared to other hard mask materials.

Figure 4C:
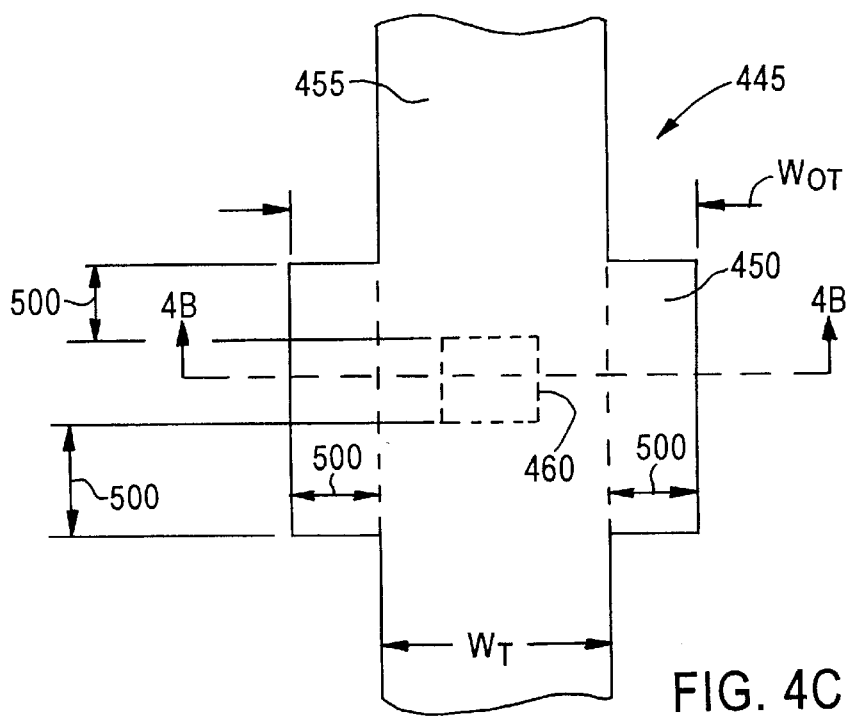

A resist 440, such as a photoresist, is then deposited over the hard mask layer 430 and patterned by conventional lithographic techniques, which include, for example, optical lithography (including, for example, I-line and deep-UV), X-ray. and E-beam lithography. The pattern formed in the resist 440 contains the features that are to be etched into the hard mask layer 430. The pattern is subsequently etched to expose underlying portions of hard mask 430. The exposed portions of the hard mask 430 are then etched using a selective anisotropic dry etch to form a trench pattern 445 in hard mask layer 430, as illustrated in FIG. 4C. Unlike conventional dual inlaid processes, this trench pattern comprises oversized trench portions 450. The oversized trench portions 450, which are merely openings in hard mask layer 430 at this stage of the process, overlie or are adjacent predetermined via locations 460. In other words, at these predetermined via locations 460, the width $W_T$ of the trench 455 is increased to an increased width $W_{OT}$ to compensate for overlay errors, as described below.

This oversized trench portions 450 include, in areas of the trench 455 overlying or adjacent predetermined via locations 460, an overlay budget 500. The overlay budget 500 itself varies in accord with the device geometry and tooling in a manner known to those skilled in the art. In a preferred aspect of the invention, an overlay budget 500 between about 30–100 nanometers per side is applied for 0.13 micron technology using a ASML (of Tempe, Ariz.) stepper. In another aspect of the invention, the overlay budget is between 40–70 nanometers per side. Generally, about 40–60% of a total overlay budget, calculated in a manner known to those skilled in the art for a specified tool and device geometry, is applied to each side of the trench 455 adjacent a predetermined via location 460 to form an oversized trench portion 450 pattern, as illustrated in FIG. 4C. For example, if the calculated or total overlay budget for a 0.13 micron technology is 100 nanometers, 40–60 nanometers is applied to each side of trench 455. Thus, if the trench 455 width $W_T$ is approximately 180 nanometers and 50 nanometers is applied to each side of the trench 455, the width $W_{OT}$ of the oversized trench portion 450 is about 280 nanometers.

In addition to application of the overlay budget 500 substantially equally to both sides of the trench 455 across a width of the trench to form oversized trench portion 460, as shown in FIG. 4C, the overlay budget 500 may be partially or totally biased toward one side of the trench 455 along a length of the trench 455 adjacent a predetermined via location 460. Thus, using the above example, a 25 nanometer overlay budget could be applied to one side of the trench and a 75 nanometer overlay budget could be applied to the other side of the trench. Other aspects of the invention include selective application of the overlay budget 500 to only one side of the oversized trench portion 450 pattern along a width or length of the trench 455. Additionally, the overlay budget 500 does not have to equally applied to the length or width of oversized trench portion 460 and the overlay budget 500 may be applied asymmetrically.

Figure 4D:
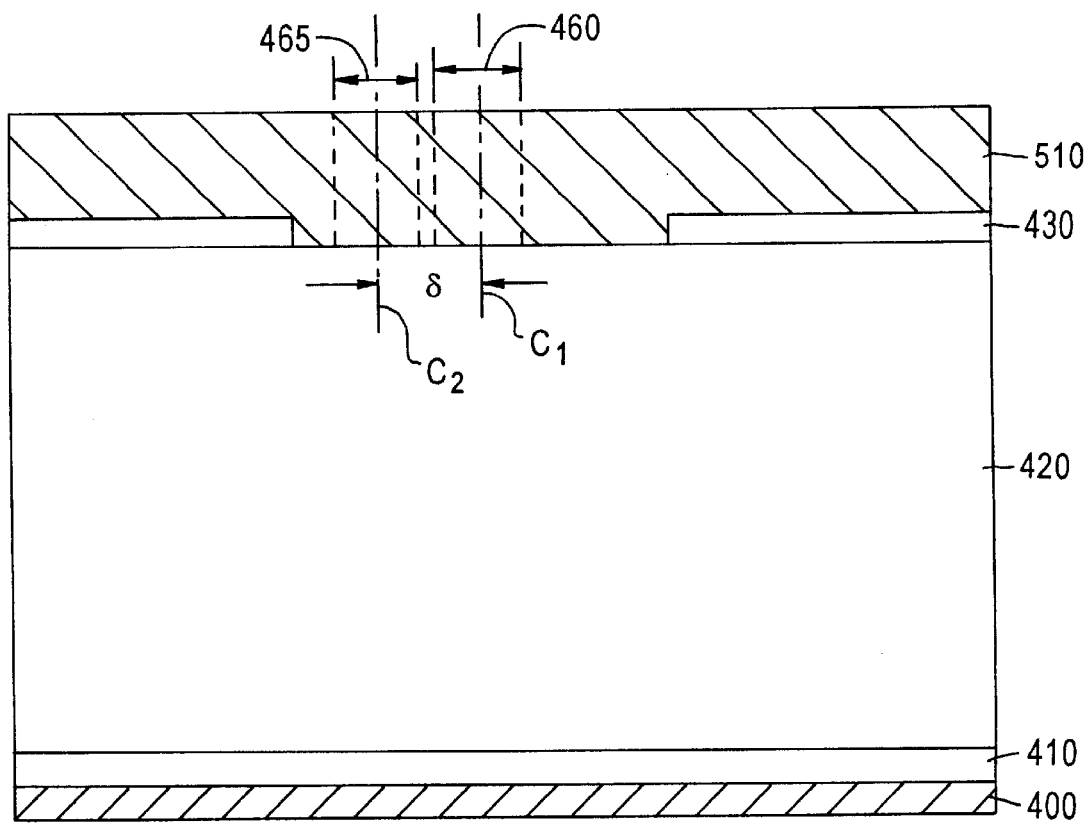
Figure 4E:
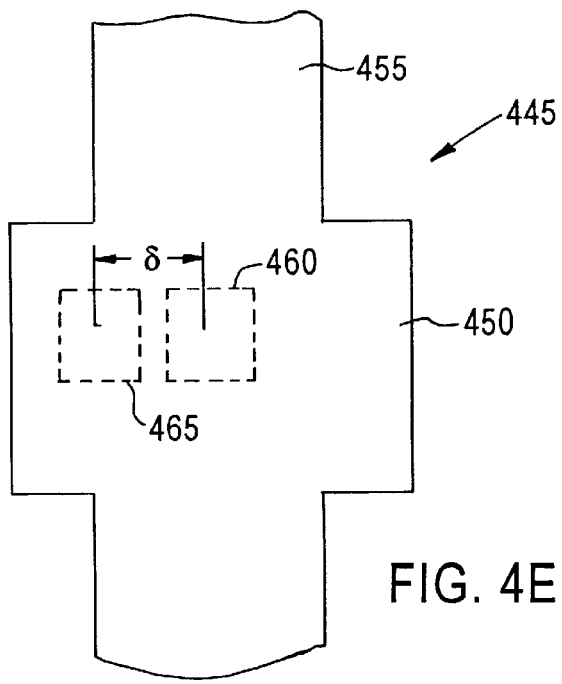

FIG. 4D shows the device structure after resist 440 is stripped away, such as by an oxygen plasma etch or by other conventional methods such as solvents, and another resist 510 is deposited. A via pattern 465, represented by the dashed lines centered about center line $C_2$, is then formed in resist 510 by conventional lithographic techniques, rioted above. Although this via pattern is desired to be formed in a predetermined via location 460, represented by the dashed lines centered about center line $C_1$, the actual via pattern 465 may be inadvertently displaced from predetermined via location 460 by an amount δ due to overlay error. As shown in FIGS. 4D and 4E, displacement amount δ is the distance from a center line $C_1$ of predetermined via location 460 to a center line $C_2$ of the actual via pattern 465.

Figure 4F:
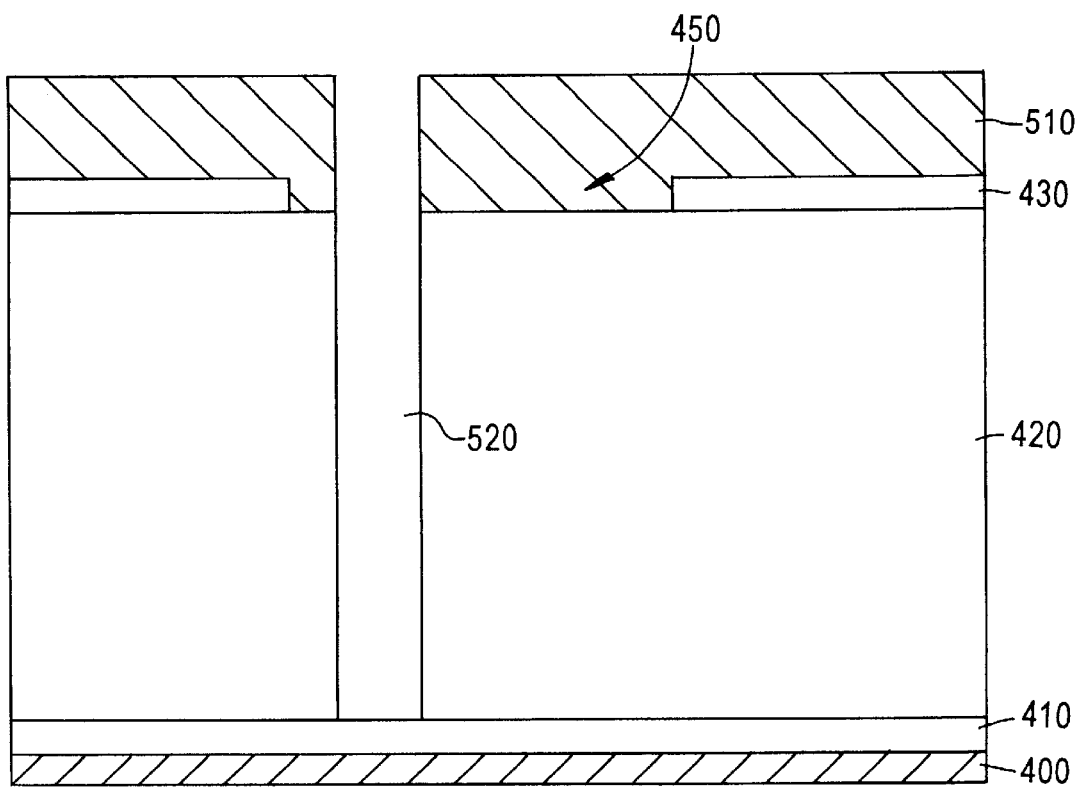

A via 520 is then etched, as shown in FIG. 4F, through via pattern 465 and dielectric layer 420 until etch stop layer 410 is reached. In accord with the invention, due to the oversized trench portion 450 pattern etched through hard mask layer 430, the displaced via 520 is still positioned entirely within the trench 455, as shown in the top-down view of FIG. 4E, in contrast to conventional methods wherein the trench side wall would intersect via 520, reducing the size of the via or requiring additional processing steps to address the deficiency. Additionally, in accord with this aspect of the invention, since the via pattern 465 is formed in a resist 510 deposited over a small step having a height equal to the thickness of hard mask layer 430, photolithographic pattern fidelity is improved over conventional methods which form the via pattern in a resist deposited over a large step having a height equal to the height of the trench.

Figure 4G:
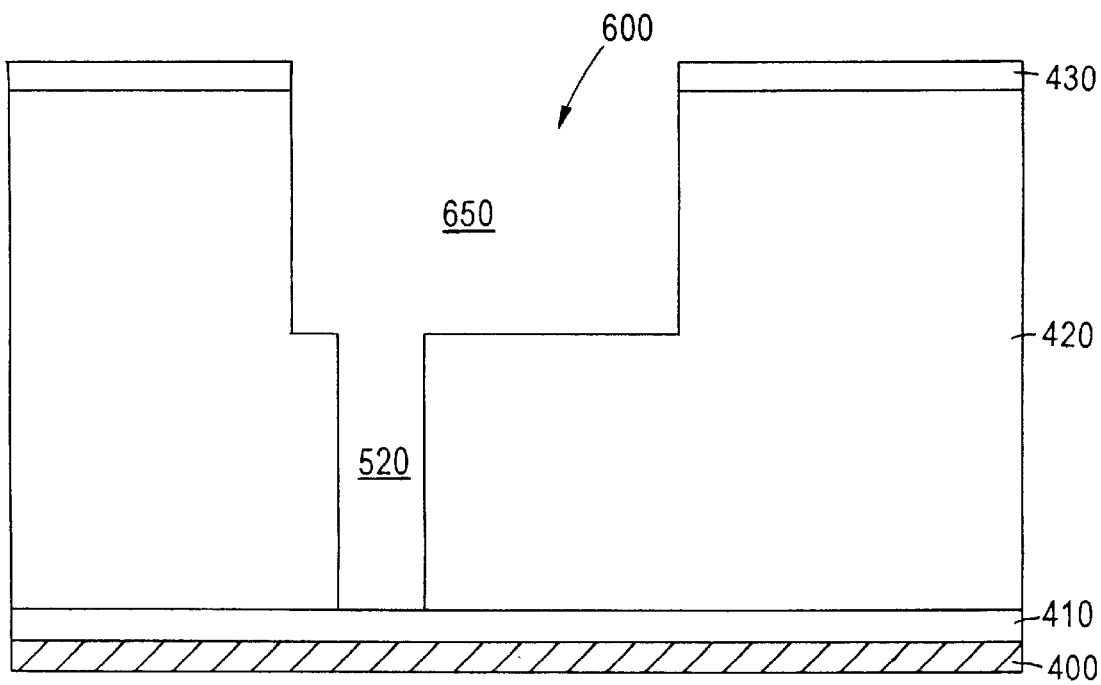

In FIG. 4G, a trench 600 and one or more oversized trench portions 650 corresponding to the oversized opening in the hard mask 430 are formed by a selective anisotropic etch of dielectric layer 420 through corresponding openings in hard mask 430. In a preferred aspect of the invention, the depth of the trench 600 and oversized trench portions 650 are controlled by closely timing the trench etch. Other methods of etch control to control a trench depth are also contemplated as being within the scope of the invention. As noted above, for example, a middle stop layer (not numbered or shown) may be deposited between a first via dielectric layer and a second trench dielectric layer to serve as an etch stop. An anisotropic etch is then performed to remove the exposed portion of etch stop layer 410 and expose the underlying metallization layer 400. For a SiN etch stop layer 410, a $CHF_3+Ar+N_2$ plasma may be used, although many other gases, etching methods, and combinations of gases may be used in accord with the process parameters and the particular etch stop layer material selected. Resist 510 may be removed prior to or subsequent to the trench etch or etch stop etch, such as by an oxygen plasma etch.

Figure 4H:
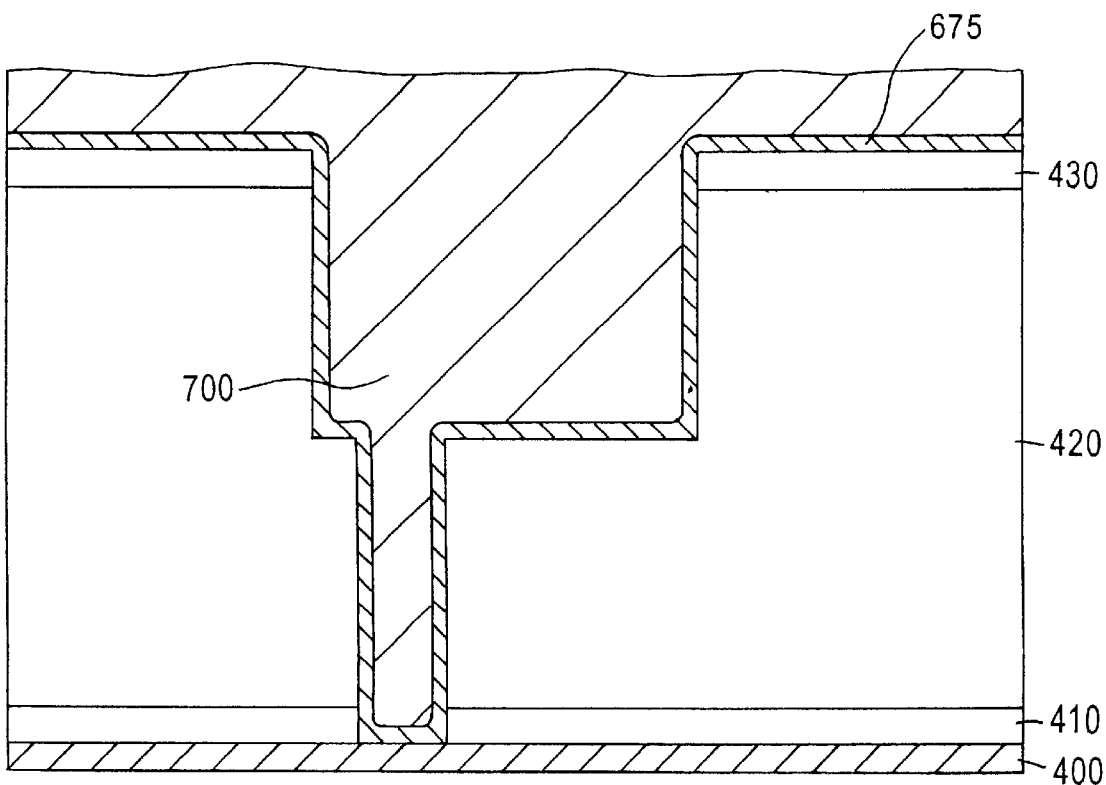
Figure 4I:
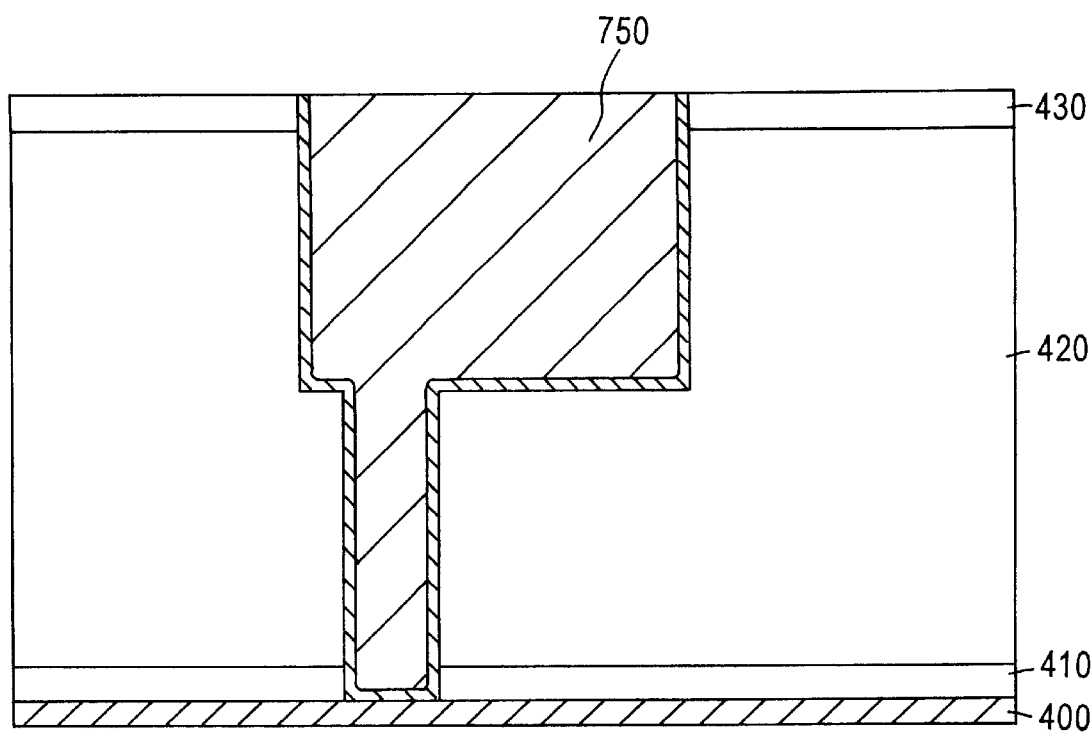

FIG. 4H shows deposition of an adhesion/barrier material, such as tantalum, titanium, tungsten, tantalum nitride, or titanium nitride, in via 500, trench 600, and oversized trench portions 650 and over the hard mask layer 430. The combination of the adhesion and barrier material is collectively referred to as a diffusion barrier layer 675, which acts to prevent diffusion of conductive material deposited in via 500, trench 600, and oversized trench portion 650 into the dielectric layer 420. A layer of a conductive material 700, for example, a Cu or Cu-based alloy, is then deposited over the diffusion barrier layer 675. A typical process initially involves depositing a "seed" layer on the diffusion barrier layer 675, followed by conventional plating techniques such as electroless or electroplating techniques, to fill the via 500, trench 600, and oversized trench portion 650. The resulting structure is then planarized, as necessary, to remove any overburden using a conventional CMP process employing a slurry, such as an alumina ($Al_2O_3$)-based slurry. The resulting structure is shown in FIG. 4J, which depicts a conductive element 750 in the via 500 and oversized trench portion 650.

Thus, the above described aspects of the present invention provides an effective and simplified solution to some of the problems associated with overlay error between successive layers in semiconductor integrated circuits by balancing and minimizing lithographic and etching disadvantages characteristic of conventional dual inlaid processes.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor structure, comprising the steps of:

etching a trench pattern opening in a hard mask layer, the trench pattern including a first portion having a first width and a second portion being an oversized trench portion having a second width greater than a width of the first portion, the second portion being formed over a predetermined via location;

after etching the trench pattern opening, depositing a resist on said hard mask layer and the trench pattern opening, and patterning a via pattern in the predetermined via location;

etching a via corresponding to the via pattern through the resist and at least partially through a dielectric layer; and etching an oversized trench portion corresponding to a second portion opening in the hard mask.

2. A method of manufacturing a semiconductor structure according to claim 1, wherein the width of the oversized trench portion is greater than the width of the trench by an amount equal to an overlay budget, wherein the overlay budget is applied to at least one side of the oversized trench portion pattern across a width of the oversized trench portion pattern.

3. A method of manufacturing a semiconductor structure according to claim 2, wherein the overlay budget is applied to at least one side of the oversized trench portion pattern across a width of the oversized trench portion pattern.

4. A method of manufacturing a semiconductor structure according to claim 3, wherein the overlay budget is applied to each side of the oversized trench portion pattern across a width of the oversized trench portion pattern.

5. A method of manufacturing a semiconductor structure according to claim 4, wherein the overlay budget applied to each side of the oversized trench portion pattern is between approximately 40–60% of a calculated overlay budget.

6. A method of manufacturing a semiconductor structure according to claim 4, wherein the overlay budget is between approximately 30 and 100 nanometers.

7. A method of manufacturing a semiconductor structure according to claim 4, wherein the overlay budget is between approximately 50 and 70 nanometers.

8. A method of manufacturing a semiconductor structure according to claim 4, wherein the overlay budget is applied to at least one side of the oversized trench portion pattern along a length of the oversized trench portion pattern.

9. A method of manufacturing a semiconductor structure according to claim 3, wherein the overlay budget is applied to each side of the oversized trench portion pattern along a length of the oversized trench portion pattern.

10. A method of manufacturing a semiconductor structure according to claim 3, wherein the dielectric layer is a low-k dielectric material.

11. A method of manufacturing a semiconductor structure according to claim 3, further comprising depositing a conductor comprising copper within at least the via and oversized trench portion.

12. A method of manufacturing a semiconductor structure, comprising the steps of:
sequentially forming a metallization layer, an etch stop layer, a dielectric layer, and a hard mask layer;
etching a trench pattern opening in a hard mask layer, the trench pattern including a first portion having a first width and a second portion being an oversized trench portion having a second width greater than a width of the first portion, the second portion being formed over a predetermined via location;
after etching the trench pattern opening, depositing a resist on said hard mask layer and the trench pattern opening, and patterning a via pattern in the predetermined via location;
etching a via corresponding to the via pattern through the resist and at least partially through a dielectric layer; and
etching an oversized trench portion corresponding to the oversized opening in the hard mask.

13. A method of manufacturing a semiconductor structure according to claim 12, wherein the width of the oversized trench portion is greater than the width of the trench by an amount equal to an overlay budget.

14. A method of manufacturing a semiconductor structure according to claim 13, wherein an overlay budget is applied to each side of the oversized trench portion pattern along a length of the oversized trench portion pattern.

15. A method of manufacturing a semiconductor structure according to claim 13, wherein said etching a via step further comprises etching the via through the dielectric layer to reach the etch stop layer.

16. A method of manufacturing a semiconductor structure according to claim 15, wherein said etching an oversized trench portion step further comprises etching the oversized trench portion using a timed etch.

17. A method of manufacturing a semiconductor structure according to claim 13, wherein the overlay budget is between approximately 30 and 100 nanometers.

18. A method of manufacturing a semiconductor structure according to claim 13, wherein the overlay budget is between approximately 40–60% of a calculated overlay budget.

19. A method of manufacturing a semiconductor structure according to claim 13, wherein the dielectric layer is a low-k dielectric material.

20. A method of manufacturing a semiconductor structure according to claim 19, further comprising the steps of:
forming a diffusion barrier layer over sidewalls of the oversized trench portion and via; and
depositing a conductor comprising copper into the oversized trench portion and via.

* * * * *